US011637359B2

(12) United States Patent
Rao et al.

(10) Patent No.: US 11,637,359 B2
(45) Date of Patent: Apr. 25, 2023

(54) EMBEDDED ANTENNAS IN INTEGRATED CIRCUITS, AND METHODS OF MAKING AND USING THE SAME

(71) Applicant: The Aerospace Corporation, El Segundo, CA (US)

(72) Inventors: Vikram M. Rao, Torrance, CA (US); Vahagn Petrosyan, Northridge, CA (US)

(73) Assignee: THE AEROSPACE CORPORATION, El Segundo, CA (US)

( * ) Notice: Subject to any disclaimer, the term of this patent is extended or adjusted under 35 U.S.C. 154(b) by 0 days.

(21) Appl. No.: 17/366,657

(22) Filed: Jul. 2, 2021

(65) Prior Publication Data

US 2023/0006331 A1  Jan. 5, 2023

(51) Int. Cl.
 *H01Q 1/22* (2006.01)
 *H01L 23/66* (2006.01)
 *H03K 19/17736* (2020.01)

(52) U.S. Cl.
 CPC .......... *H01Q 1/2283* (2013.01); *H01L 23/66* (2013.01); *H03K 19/17744* (2013.01); *H01L 2223/6677* (2013.01)

(58) Field of Classification Search
 None
 See application file for complete search history.

(56) References Cited

U.S. PATENT DOCUMENTS

| 6,373,447 | B1* | 4/2002 | Rostoker | G06K 19/07779 |
| | | | | 257/491 |
| 7,398,379 | B1* | 7/2008 | Wong | G06F 30/34 |
| | | | | 326/38 |
| 10,411,752 | B1* | 9/2019 | Halim | H01L 23/66 |
| 10,593,634 | B2* | 3/2020 | Kook | H01L 23/49555 |
| 2010/0297954 | A1* | 11/2010 | Rofougaran | H04B 1/40 |
| | | | | 455/73 |

FOREIGN PATENT DOCUMENTS

WO  WO-2018170581 A1 *  9/2018  .......... A43B 3/0005

OTHER PUBLICATIONS

Couch, et al., "An Analysis of Implanted Antennas in Xilinx FPGAs." International Conference on Reconfigurable Computing and FPGAs 1-6 (2011) DOI:10.1109/ReConFig.2011.9.
Recio, et al., "Physical Layer for Spectrum-Aware Reconfigurable OFDM on an FPGA," IEEE Computer Society 321-327 (2010) DOI.10.1109/DSD.2010.110.

(Continued)

*Primary Examiner* — Anh Q Tran
(74) *Attorney, Agent, or Firm* — Snell & Wilmer LLP (57) ABSTRACT

Embedded antennas in integrated circuits, and methods of making and using the same, are provided herein. An integrated circuit within a semiconductor die may include a control circuit; an antenna configured to wirelessly receive a control signal at a predefined frequency; and an interconnect configured to provide the received control signal from the antenna to the control circuit. The control circuit may be configured to control a function of the integrated circuit responsive to the received control signal.

20 Claims, 4 Drawing Sheets
(2 of 4 Drawing Sheet(s) Filed in Color)

(56) References Cited

OTHER PUBLICATIONS

Srikanteswara, et al., "An Overview of Configurable Computing Machines for Software Radio Handsets." IEEE Communications Magazine 134-141 (2003).
Tavaragiri, et al., "Exploration of FPGA Interconnect for the Design of Unconventional Antennas." 1-7 (2011).
Zhang, et al., "All Digital FPGA Based FM Radio Receiver." SDR Forum Technical Conference 1-5 (2007).

* cited by examiner

EMBEDDED ANTENNAS IN INTEGRATED CIRCUITS, AND METHODS OF MAKING AND USING THE SAME

FIELD

The present application relates to antennas for use with integrated circuits, such as field programmable gate arrays or application specific integrated circuits.

BACKGROUND

Integrated circuits (ICs), such as field programmable gate arrays (FPGAs) and application specific integrated circuits (ASICs), may be coupled to external antennas via which information may be wirelessly received or transmitted. Front end circuitry, such as analog-to-digital converters, may be located between the external antenna and the integrated circuit and used to process a received signal for use by the integrated circuit.

SUMMARY

Embedded antennas in integrated circuits, and methods of making and using the same, are provided herein.

Under one aspect, an integrated circuit within a semiconductor die is provided. The integrated circuit may include a control circuit. The integrated circuit may include an antenna configured to wirelessly receive a control signal at a predefined frequency. The integrated circuit may include an interconnect configured to provide the control signal from the antenna to the control circuit. The control circuit may be configured to control a function of the integrated circuit responsive to the received control signal.

In some examples, the antenna includes a first patterned metal layer. In some examples, the first patterned metal layer is disposed over the control circuit. In some examples, the first patterned metal layer is the top metal layer in the semiconductor die. In some examples, the interconnect includes a second patterned metal layer disposed over the control circuit and disposed below the first patterned metal layer.

In some examples, the integrated circuit includes a field-programmable gate array (FPGA). In some examples, the integrated circuit includes an application specific integrated circuit (ASIC).

In some examples, the integrated circuit includes a field-programmable gate array (FPGA), and the antenna and the interconnect are programmed into configurable logic blocks of the FPGA.

In some examples, the antenna includes a monopole.

In some examples, the antenna has a length between about 1 μm and about 50 mm.

In some examples, the semiconductor die includes silicon, gallium arsenide, germanium, silicon-germanium, gallium nitride, or a combination thereof.

In some examples, the predefined frequency is between about 1 MHz and about 1000 MHz.

In some examples, the control signal includes an encryption key, and wherein the control circuit is configured to apply the encryption key to the function of the integrated circuit.

In some examples, the control circuit is configured to enable the function of the integrated circuit responsive to the control signal.

In some examples, the control circuit is configured to disable the function of the integrated circuit responsive to the control signal.

In some examples, the control circuit is configured to alter an output of the integrated circuit responsive to the control signal.

In some examples, the integrated circuit further includes an analog front-end circuit coupled to the antenna and configured to process the received signal for use by the control circuit.

In some examples, the integrated circuit further includes an analog-to-digital converter coupled to the antenna and configured to digitize the received signal for use by the control circuit.

Under another aspect, a method of making an integrated circuit within a semiconductor die is provided. The integrated circuit may have a function. The method may include providing a control circuit within the semiconductor die. The method may include providing an embedded antenna within the semiconductor die. The method may include providing an interconnect between the control circuit and the antenna. The control circuit may be configured to control the function of the integrated circuit responsive to a control signal wirelessly received by the embedded antenna.

Under another aspect, a method of controlling an integrated circuit is provided. The method may include providing an integrated circuit within a semiconductor die, the integrated circuit including an embedded antenna and a control circuit. The method may include wirelessly receiving a control signal by the embedded antenna. The method may include providing the received control signal to the control circuit. The method may include controlling, by the control circuit, a function of the integrated circuit responsive to the control signal.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Embedded antennas in integrated circuits, and methods of making and using the same, are provided herein. For example, an antenna for receiving wireless signals may be embedded within an integrated circuit in a semiconductor die, such as a field-programmable gate array (FPGA) or an application specific integrated circuit (ASIC). The antenna may be configured to receive a wireless signal at a predefined frequency, and may not receive wireless signals at other frequencies. The wireless signal received by the antenna may include a control signal that may be used to control a function of the integrated circuit. For example, the integrated circuit may include a control circuit connected to the antenna by interconnects, and the control circuit may be configured to implement logic to control a function of the integrated circuit responsive to the received control signal. Illustratively, the control circuit may enable or disable, or otherwise modify, one or more functions of the circuit responsive to the received control signal.

In some examples, the embedded antenna and its interconnects to control circuit(s) may be hard wired during fabrication of the semiconductor die at the foundry by patterning one or more metal layers of the semiconductor die, e.g., of the FPGA or ASIC. In other examples, the antenna and its interconnects to control circuit(s) may be programmed into configurable logic blocks (CLBs) of an FPGA via programmable interconnects, and optionally may be reprogrammable. The integrated circuit may, but need not necessarily, further include an embedded analog front-end circuit and/or an analog-to-digital converter (ADC) circuit, which may be utilized to prepare an analog signal from the embedded antenna to a digital signal for use by other functional elements (e.g., logic devices and/or storage devices) of the integrated circuit. Embedding the antenna, the antenna's interconnects to control circuit(s), and associated circuitry (such as the front-end circuit and/or ADC) in the integrated circuit may obviate the need for external antennas, interconnects, associated circuitry, and the like, and thus may reduce weight and complexity of a chipset that includes the integrated circuit. Additionally, the embedded antenna, interconnects, and associated circuitry may be incorporated within the integrated circuit in a manner that is physically obfuscated and, thus, may enhance hardware security aspects of the circuit. For example, embedding the antenna within the semiconductor die may inhibit reverse engineering or unauthorized use.

Implantation of an antenna within an integrated circuit in accordance with aspects of this disclosure may provide numerous advantages over conventional systems that include external antennas. For example, in some embodiments, an embedded antenna within the integrated circuit may provide more compact form factors and/or may permit a reduction of weight of equipment that includes such circuitry. In addition or in other embodiments, the embedded antenna may permit the remote activation of the integrated circuitry and/or other types of remote control of the operation of such circuitry. Thus, in some implementations, the embedded antenna may be utilized as part of a dedicated receiver (e.g., an emergency receiver) assembled within circuitry of a satellite system, other types of spacecraft, and/or remotely located equipment. For another example, the embedded antenna may provide an obfuscated layer of hardware security, permitting or otherwise facilitating hardware security applications that may enhance protection against reverse engineering and/or unauthorized access and/or use; or that may permit wireless key loading.

Figure 1:
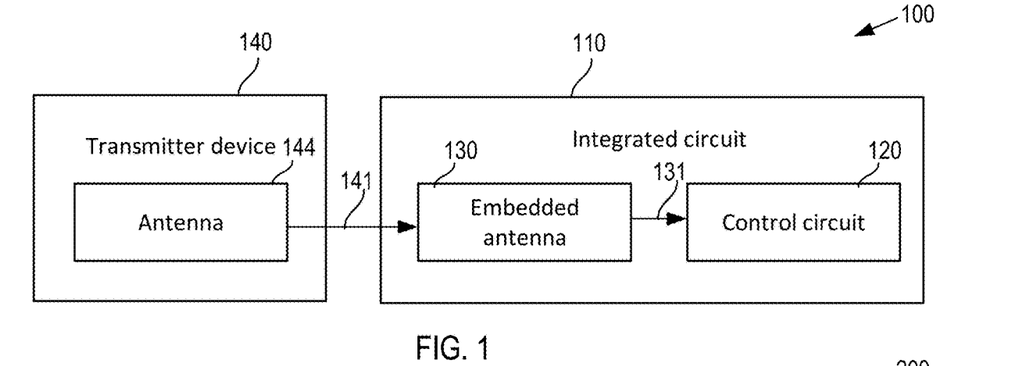
FIG. 1 schematically illustrates components of a system including an integrated circuit with an embedded antenna, according to some examples provided herein.

With reference to the drawings, FIG. 1 schematically illustrates components of a system including an integrated circuit with an embedded antenna, according to some examples provided herein. The system 100 includes an integrated circuit 110 within a semiconductor die, e.g., including a solid substrate having patterned metal layers, patterned semiconductor layers, patterned insulating layers, and the like, disposed thereon. The integrated circuit 110 may be embodied in or may include, for example, a FPGA or an ASIC. In examples in which the integrated circuit 110 includes an ASIC, the ASIC may include hard-wired circuit components that are defined at the time of manufacture. In examples in which the integrated circuit includes an FPGA, the FPGA may include reprogrammable circuit components, such as CLBs, and programmable interconnects. Integrated circuit 110 may be implemented using any suitable semiconductor(s), such as silicon, gallium arsenide, silicon-germanium, gallium nitride, or a combination thereof.

Integrated circuit 110 includes a control circuit 120 and an embedded antenna 130 that are coupled to one another by at least one interconnect 131. The embedded antenna 130, control circuit 120, and interconnect(s) 131 therebetween are formed in the same semiconductor die as one another, e.g., may be formed by elements that are disposed on the same solid substrate as one another, and may be packaged together, e.g., within ceramic packaging.

The control circuit 120 may be embodied in or may include one or more circuit components configured to control a function of the integrated circuit 110 responsive to the received control signal. The one or more components may permit or otherwise facilitate the implementation of a defined digital design that may provide at least part of the control circuit 120.

The embedded antenna 130 may include one or more metal layers that, together, provide an antenna configured to receive a wireless signal at a predefined frequency. One skilled in the art readily may select the particular shape and size of the embedded antenna 130 so as to resonate at a predefined frequency, e.g., a frequency between about 1 MHz and about 1000 MHz, e.g., between about 10 MHz and about 500 MHz, e.g., between about 50 MHz and about 150 MHz. The bandwidth of embedded antenna 130 may have any suitable value, e.g., may be about 1 MHz to about 100 MHz, or about 1 MHz to about 50 MHz, or about 1 MHz to about 20 MHz, or about 5 MHz to about 20 MHz, or about 10 MHz to about 20 MHz, or about 15 MHz. For example, the embedded antenna 130 may have one or more defined types, e.g., may include a directional antenna, a non-directional antenna, a monopole antenna, a dipole antenna, a folded-dipole antenna, a patch antenna, or the like, which are defined by one or more patterned metal layers of integrated circuit 110. In one specific, nonlimiting example, embedded antenna 130 may include a monopole antenna. In nonlimiting examples, the embedded antenna 130 may have a length between about 1 μm and about 100 mm, e.g., between about 10 μmm and about 50 mm. The length of embedded antenna 130 may be wrapped around a plane that occupies a footprint defined by a footprint length and a footprint width. In nonlimiting examples, the embedded antenna may occupy a footprint of about 1 mm by 1 mm to about 1 cm by 1 cm. In nonlimiting examples, the embedded antenna 130 may have a width between about 10 nm and about 10 μm, e.g., between about 10 nm and about 500 nm. In nonlimiting examples, the embedded antenna 130 may have a thickness between about 1 nm and about 1 μm, e.g., between about 10 nm and about 500 nm. It will be appreciated that the particular metal(s) used, the dimensions of embedded antenna 130, and the resonance frequency of the embedded antenna will depend on the particular foundry, node, and processes used to prepare the antenna.

In addition, in the example illustrated in FIG. 1, the embedded antenna 130 may be electrically coupled and mechanically coupled to at least a portion of the control circuit 120 via one or more interconnects 131 which may be defined by one or more patterned metal layers of integrated circuit 110. In some examples, the embedded antenna 130 and interconnect(s) 131 may be formed utilizing routing elements within the integrated circuit 110, such as any suitable combination of vias, traces, metal pillars, routing metals, or other types of conductive interconnects that operatively couple the antenna 130 to control circuit 120. Any suitable combination of such routing elements may extend vertically through the integrated circuit or may extend horizontally along the integrated circuit. As such, receive characteristics of the embedded antenna 130, such as directionality, spectral response, operational bandwidth, and receive power, may be determined, at least in part, by the shape, length and orientation(s) of the conductive interconnect(s) or routing metal(s) utilized to fabricate the antenna.

In some examples, embedded antenna 130 may include, or may be formed by, a first patterned metal layer. The first patterned metal layer may be disposed over the control circuit 120. Illustratively, the first patterned metal layer may be or include the top metal layer in the semiconductor die of integrated circuit 110. Interconnect 131 may include, or may be formed by, a second patterned metal layer that is disposed over control circuit 120 and disposed under the first patterned metal layer, e.g., that includes patterned portions that extend vertically through integrated circuit 110. In some examples, the patterned metal layer forming embedded antenna 130 may be provided in an FPGA or in an ASIC. Alternatively, when the integrated circuit 110 includes an FPGA, the embedded antenna 130 and interconnect 130 may be programmed into CLBs of the FPGA.

In contrast to conventional integrated circuits that utilize or otherwise leverage an external antenna, the embedded antenna 130 may permit wireless input to the control circuit 120 without reliance on input/output (I/O) pins or other types of I/O interfaces. In the example system 100 illustrated in FIG. 1, transmitter device 140 includes antenna 144 that transmits a control signal to embedded antenna 130 via wireless transmission path 141. Antenna 144 may be configured so as to transmit the control signal at or about the predetermined frequency of embedded antenna 130, e.g., at a frequency between about 50 MHz and about 1000 MHz, e.g., within the bandwidth of the embedded antenna at about the predetermined frequency. Antenna 144 may include a monopole antenna, or any other suitable type of antenna such as a directional antenna, a non-directional antenna, a dipole antenna, a folded-dipole antenna, a patch antenna, or the like. Antenna 144 may have any suitable length, e.g., of about 10 cm to about 100 cm, or about 20 cm to about 50 cm. Antenna 144 may transmit the control signal at sufficient power that the signal has sufficient power when received by embedded antenna 130 that the function of integrated circuit 110 may be controlled using it. In one purely illustrative example, the Friis transmission equation (1) below is used to calculate the received power Pr at embedded antenna 130:

$$Pr = Pt + Gt + Gr + 20\log 10(\text{wavelength}/4*\pi*R) \quad (1)$$

where R is the distance between transmit antenna and receive antenna, Pt is transmit power, for example 100 W, Gt is transmit antenna gain, for example 3 dB, and Gr is the receive antenna gain, which is assumed to be approximately zero. For an example distance R of 9 m, Pr is 22 dBm, and for an example distance R of 3 m, Pr is 31 dBm.

As such, embedded antenna 130 may receive the control signal and provide it to control circuit 120 via interconnect 131. In comparison, if another external antenna (e.g., an antenna being used by a nefarious actor) attempts to transmit a control signal at a frequency other than the predetermined frequency (e.g., because the holder of the external antenna does not know the predetermined frequency) then embedded antenna 130 may not properly receive that control signal and therefore may not provide that control signal to control circuit 120 for use in controlling the function of the integrated circuit 110.

The transmitter device 140 may be provided in any suitable platform. In one scenario, both the transmitter device 140 and integrated circuit 110 may be terrestrial. In other scenarios, the transmitter device 140 may be on board of a spacecraft that includes the integrated circuit 110, or transmitter device 140 and integrated circuit 110 may be on different spacecraft. In yet other scenarios, the transmitter device 140 may be integrated within the integrated circuit 110 or within another IC. In other scenarios, the transmitter device 140 may be included in a circuit board (e.g., a printed circuit board (PCB), a motherboard, or the like) on which the integrated circuit 110 is mounted or in another circuit board. Antenna 144 of transmitter device 140 may transmit the control signal to embedded antenna 130 over any suitable radio channel, such as a wireless point-to-point communication channel (e.g., a BLUETOOTH® channel, a near-field communication (NFC) communication channel, and/or a channel for communication between radiofrequency identification (RFID) devices).

The control signal that embedded antenna 130 receives, e.g., from antenna 144 of transmitter device 140, may be used to control a function of integrated circuit 110. Therefore, in some implementations, the embedded antenna 130 and the control circuit 120 may be considered to provide a dedicated receiver that may control the operation of the integrated circuit 110 using, at least in part, the control signal received wirelessly by the embedded antenna 130. For example, the control signal may include a sequence of signals that control circuit 120 is configured to respond to appropriately. Transmitter device 140 and control circuit 120 may be programmable to define an appropriate unique or custom pattern for the control signal so as to help ensure that the pattern cannot be readily guessed by a third party trying to control a function of integrated circuit 110. For example, the control signal may include encryption information (e.g., an encryption key). Control circuit 120 may apply the encryption key to the function of the integrated circuit 110, e.g., so as to decrypt information that integrated circuit 110 may be generating or may store. In addition or in another example, the control signal may include an activation signal causing control circuit 120 to activate or deactivate one or more components of the integrated circuit 110 or a portion thereof, e.g., to activate or deactivate one or more elements of the control circuit 120 itself. Illustratively, the control signal may direct the control circuit 120 to the integrated circuit 110 or a portion thereof to transition from a low-power state (e.g., an OFF state) to a high-power state (e.g., an ON state); or may direct the control circuit 120 to the integrated circuit 110 or a portion thereof to transition from high-power state (e.g., an ON state) to a low-power state (e.g., an OFF state). Illustratively, the control signal may include a protocol for initiating or disabling remote inductive power transfer or charging; for example, integrated circuit 110 may be coupled to, or may include, functional elements (e.g., inductive coils) that control circuit 120 may activate or deactivate responsive to the control signal so as to cause integrated circuit 110 to begin or stop receiving or generating power using such functional elements.

Additionally, or alternatively, the control signal may cause the control circuit 120 to alter an output of the integrated circuit 110 responsive to the control signal, e.g., so as to enable or disable the function of the integrated circuit 110. For example, the control signal may include a first instruction that may direct or otherwise cause the control circuit 120 to transition integrated circuit 110 or a portion thereof to a first defined state (e.g., a locked state) in which defined functionality is unavailable (or locked) and the integrated circuit generates a first output which may be or include a null output, or an incorrect output. Alternatively, the integrated circuit may by default be in the first defined state without need for receiving the first instruction. Additionally, or alternatively, the control signal may include a second instruction that may direct or otherwise cause the control circuit 120 to transition integrated circuit 110 or a portion thereof to a second defined state (e.g., an unlocked state) and the integrated circuit generates a second output which may be or include a correct output. As such, the second instruction may cause or otherwise direct the unlocking of the integrated circuit 110 or the portion thereof wirelessly, without reliance on information received via any I/O pin(s) that may be included in the integrated circuit 110.

Note that a nefarious entity attempting to obtain information from integrated circuit 110 by attempting to transmit a control signal at different frequencies that does not match the predetermined frequency of the embedded antenna, may receive an incorrect output from the integrated circuit at each of such frequencies. As such, the nefarious entity may be inhibited from identifying which frequency is correct, even if they search the entire relevant frequency space. Additionally, it will be appreciated that the embedded antenna 130 may be physically obfuscated within the integrated circuit 110, thus mitigating or avoiding reverse-engineering issues and/or inspection attacks. In a scenario in which the integrated circuit 110 is embodied in or includes an ASIC, the embedded antenna 130 may be assembled underneath a metal fill layer and may traverse different metal layers. Such an assembly may obfuscate the embedded antenna 130 in case of de-capping or delayering of the ASIC. Similarly, in examples in which the integrated circuit 110 is embodied in or includes an FPGA, the embedded antenna 130 may be provided through CLBs of the FPGA and thus may be obfuscated in case of disassembly of the FPGA.

Figure 2:
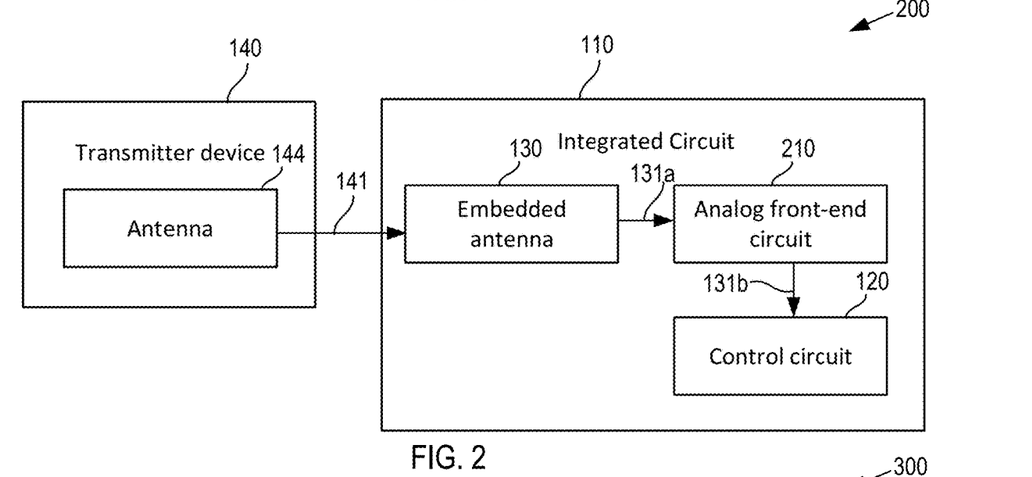
FIG. 2 schematically illustrates components of another system including an integrated circuit with an embedded antenna and an embedded analog front-end circuit, according to some examples provided herein.

FIG. 2 schematically illustrates components of another system including an integrated circuit with an embedded antenna, according to some examples provided herein. The system 200 includes the integrated circuit 110 having the control circuit 120 and the embedded antenna 130 which may be configured similarly as described with reference to FIG. 1, as well as an analog front-end (AFE) circuit 210. Similarly as described with reference to FIG. 1, embedded antenna 130 may receive a control signal at a predefined frequency, via wireless transmission path 141, from antenna 144 of transmitter device 140. In the example illustrated in FIG. 2, in the system 200, the embedded antenna 130 may be electrically coupled and mechanically coupled via first interconnect 131a to AFE 210 that may convert and process an analog output signal received from the embedded antenna 130. For example, AFE circuit 210 may demodulate, decode, and/or filter the signal received by embedded antenna 130 to generate a processed analog output signal. The AFE circuit 210 may be electrically coupled and mechanically coupled via second interconnect 131b to the control circuit 120 and may provide the processed analog output signal to the control circuit 120. While the AFE 210 is illustrated as being integrated into the integrated circuit 110, the disclosure is not limited in that respect and, in some embodiments, the AFE circuit 210 may be assembled externally to the integrated circuit 110.

Figure 3:
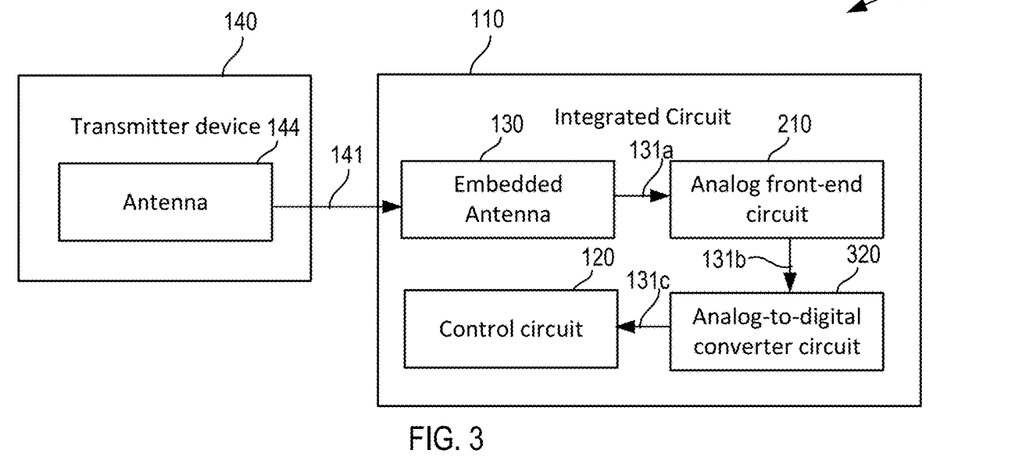
FIG. 3 schematically illustrates components of another system including an integrated circuit with an embedded antenna, embedded analog front-end circuit, and embedded analog-to-digital converter circuit, according to some examples provided herein.

FIG. 3 schematically illustrates components of another system including an integrated circuit with an embedded antenna, according to some examples provided herein. The system 300 includes the integrated circuit 110 having the control circuit 120, the embedded antenna 130, and the AFE circuit 210 which may be configured similarly as described with reference to FIG. 1, as well as an analog-to-digital (ADC) converter circuit 320. Similarly as described with reference to FIG. 1, embedded antenna 130 may receive a control signal at a predefined frequency, via wireless transmission path 141, from antenna 144 of transmitter device 140. Similarly as described with reference to FIG. 2, the embedded antenna 130 may be electrically coupled and mechanically coupled via first interconnect 131a to AFE 210 that may convert and process an analog output signal received from the embedded antenna 130. ADC circuit 320 may receive the processed analog output signal from the AFE circuit 210 via second interconnect 131b, and may generate a digital output signal based thereon. The ADC circuit 320 may be electrically coupled and mechanically coupled to the control circuit 120 via third interconnect 131c, and may provide at least a portion of the digital output signal to the control circuit 120. While the ADC circuit 320 is illustrated as being integrated into the integrated circuit 110, the disclosure is not limited in that respect and, in some embodiments, the ADC circuit 320 may be assembled externally to the integrated circuit 110.

Figure 4:
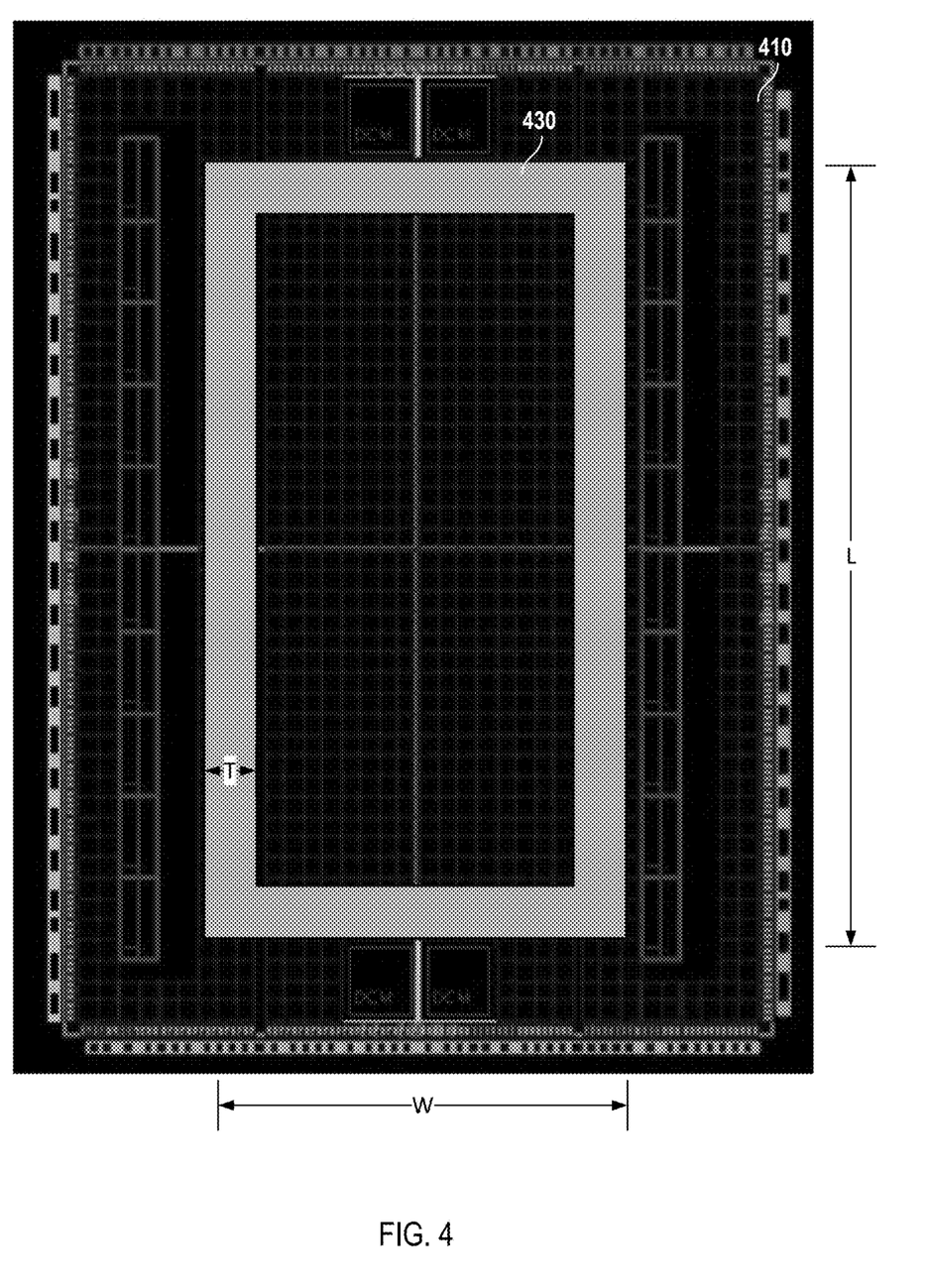
FIG. 4 schematically illustrates a simplified plan view of an embedded antenna in an FPGA, according to some examples provided herein.

It will be appreciated that antenna 130 may have any suitable configuration to receive a control signal at a predefined frequency. For example, FIG. 4 schematically illustrates a simplified plan view of an embedded antenna in an FPGA, according to some examples provided herein. More specifically, FIG. 4 illustrates embedded antenna 430 overlaid on a graphic of the Xilinx FPGA floorplanning tool. As illustrated in FIG. 4, antenna 430 is approximately rectangular with footprint width W, footprint length L, and trace width T. Nonlimiting ranges for widths, lengths, and thicknesses of antennas are provided elsewhere herein. In some examples, W is slightly less than the width of the FPGA, L is slightly less than the length of the FPGA, and T may be a fraction of the width of the FPGA, e.g., about 10% or less of the width of the FPGA. Illustratively, depending on the particular FPGA used, the package size may be about 8 mm by 8 mm to 30 mm by 30 mm, values of W suitably may range from about 1 mm to 30 mm, example values of L may range from about 1 mm to 30 mm, and example values of T may range from 10 nm to 1 μm. It will be appreciated that antenna 430 need not necessarily be rectangular, and indeed may have any suitable shape such as square, concentric squares or rectangles, quantized spirals, quantized circles, and the like.

Antenna 430 suitably may be configured for compatibility with FPGA 410. For example, FPGA 410 may include different technology types such as static random-access memory (SRAM), flash, or antifuse, and antenna 430 may be formed using the same existing elements that the FPGA 410 otherwise uses to form traces. Additionally, FPGA 410 may include one or more physical structures for implementing logic, which may be referred to as hard intellectual property ("hard IP") cores, such as a system on a chip (SoC), serializer/deserializer (SerDes), or the like, and antenna 430 and any associated interconnects may be routed around such physical structures. Additionally, FPGA 410 may have a particular semiconductor die size, and antenna 430 may be sized so as to fit within that die while still being able to receive the control signal at the predetermined frequency. Additionally, FPGA 410 may be fabricated at a particular process node, and antenna 430 may be fabricated at the same process node which may limit one or more of the dimensions (e.g., thickness) of embedded antenna 430 and any interconnects thereto. Additionally, FPGA 430 may have a particular switch block limitation, and antenna 430 may be configured to receive the control signal at a frequency that is compatible with that switch block configuration. Additionally, the device packaging of FPGA 410 may reduce the strength of the control signal that embedded antenna 430 receives wirelessly, and as such, embedded antenna 430 may be configured to have sufficient gain to receive the control signal at sufficient strength, through the packaging, for use in controlling FPGA 410. For example, antenna 430 may be provided in upper layer(s) of FPGA 410 so as to reduce the amount of material between the antenna and the antenna 144 of transmitter device 140. Additionally, antenna 430 may be configured so as to be compatible with the FPGA 410 device and speed grade, because it is formed using the same elements as FPGA.

Figure 5:
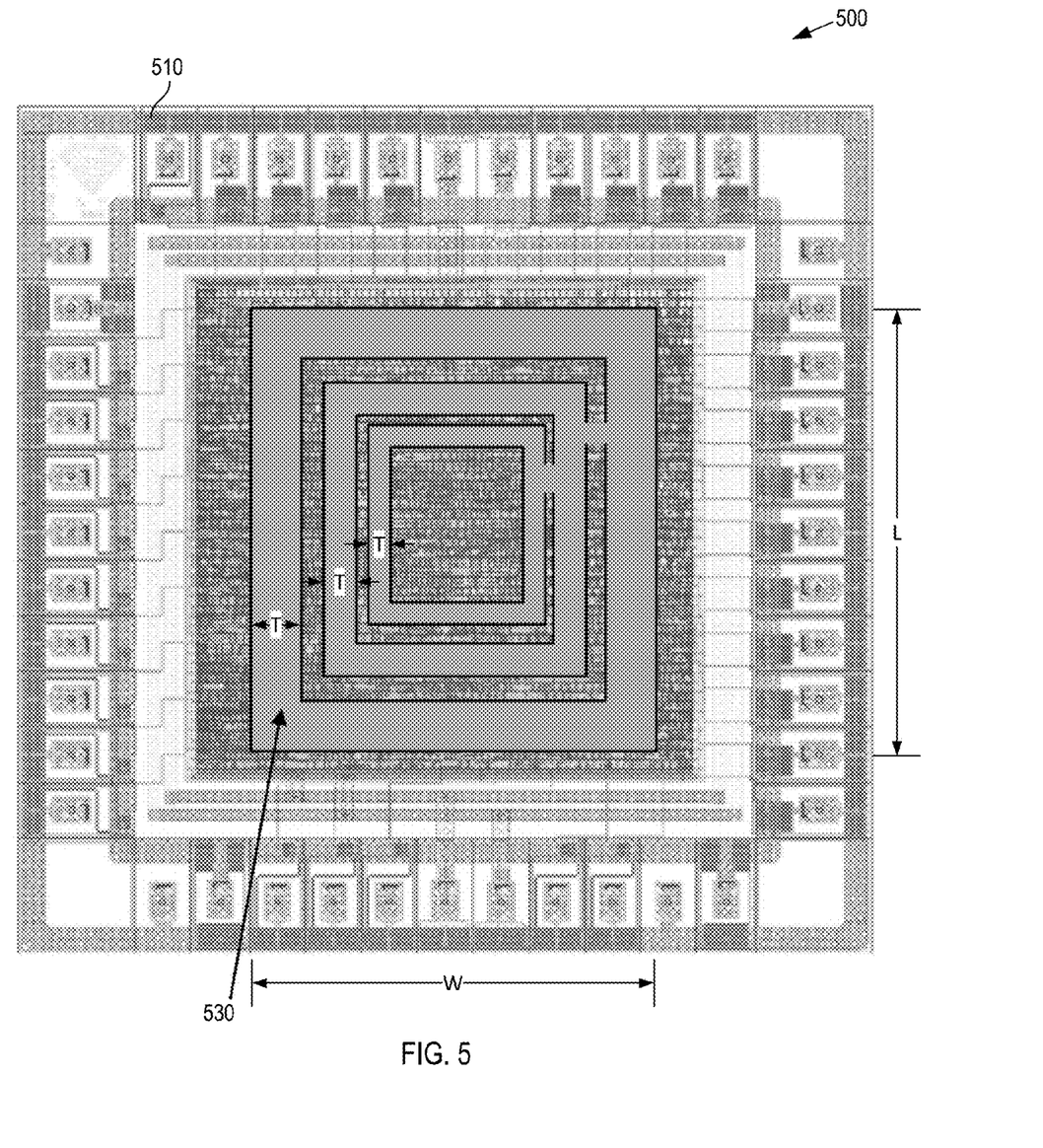
FIG. 5 schematically illustrates a simplified plan view of an embedded antenna in an ASIC, according to some examples provided herein.

FIG. 5 schematically illustrates a simplified plan view of an embedded antenna in an ASIC, according to some examples provided herein. More specifically, FIG. 5 illustrates embedded antenna 530 overlaid on a graphic of an example ASIC. As illustrated in FIG. 5, antenna 530 includes concentric squares that are coupled to one another. The overall footprint of antenna 530 is approximately square with footprint width W and footprint length L, and different portions of antenna 530 may have different trace width T. Nonlimiting ranges for widths, lengths, and thicknesses of antennas are provided elsewhere herein. In some examples, W is slightly less than the width of the ASIC, L is slightly less than the length of the ASIC, and T may be a fraction of the width of the ASIC, e.g., about 10% or less of the width of the ASIC. Illustratively, depending on the particular ASIC used, the package size may be about 1 mm by 1 mm to 10 mm by 10 mm, W may range from about 100 nm to 5 mm, L may range from about 100 nm to 5 mm, and T may range from 10 nm to 1 µm. It will be appreciated that antenna 530 need not necessarily include concentric squares, and indeed may have any suitable shape(s) such as rectangular, square, quantized spiral, quantized circle, and the like.

Antenna 530 suitably may be configured for compatibility with ASIC 510. For example, ASIC 510 may include one or more physical structures for implementing logic, which may be referred to as hard intellectual property ("hard IP") cores, such as a system on a chip (SoC), serializer/deserializer (SerDes), or the like, and antenna 530 and any associated interconnects may be routed around such physical structures. Additionally, ASIC 510 may have a particular semiconductor die size, and antenna 530 may be sized so as to fit within that die while still being able to receive the control signal at the predetermined frequency. Additionally, ASIC 510 may be fabricated at a particular process node, and antenna 530 may be fabricated at the same process node which may limit one or more of the dimensions (e.g., thickness) of embedded antenna 530 and any interconnects thereto. Additionally, the device packaging of ASIC 510 may reduce the strength of the control signal that embedded antenna 530 receives wirelessly, and as such, embedded antenna 530 may be configured to have sufficient gain to receive the control signal at sufficient strength, through the packaging, for use in controlling ASIC 510. For example, antenna 530 may be provided in upper layer(s) of ASIC 510 so as to reduce the amount of material between the antenna and the antenna 144 of transmitter device 140. In one nonlimiting example, antenna 530 may be provided using the top metal layer of the process used to form ASIC 510.

Figure 6:
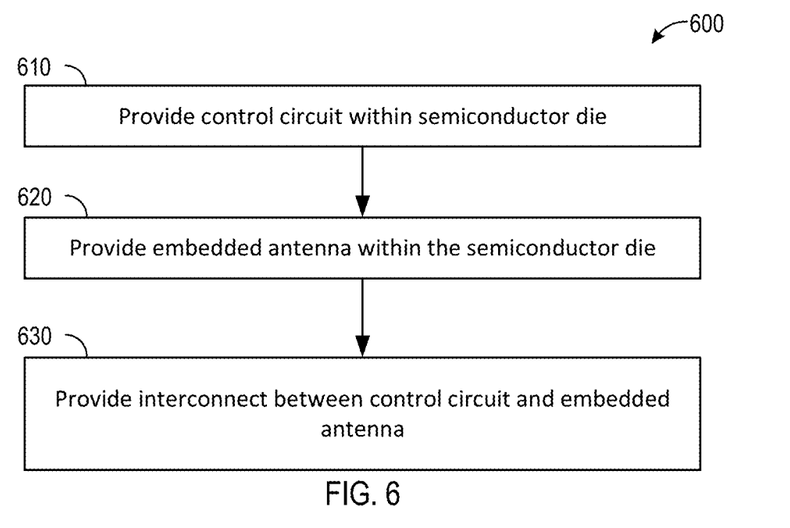
FIG. 6 illustrates a flow of steps in a method for providing an embedded antenna in an integrated circuit, according to some examples provided herein.
Figure 7:
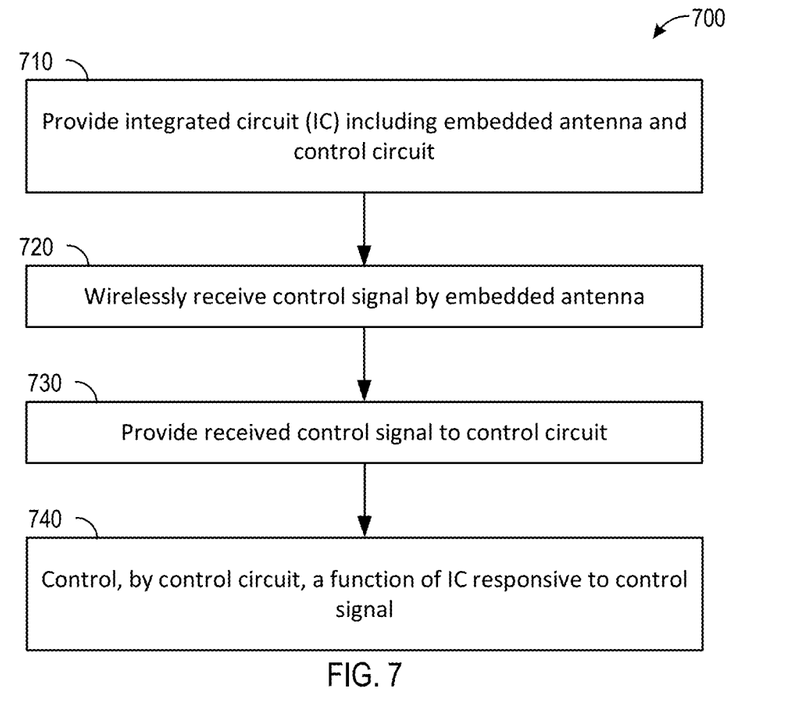
FIG. 7 presents a flow of steps in a method for operating an embedded antenna in an integrated circuit, according to some examples provided herein.

In view of the various aspects described herein, methods for providing an IC having embedded therein an antenna and for configuring operation of the IC according to aspects of this disclosure may be better appreciated with reference to FIGS. 6-7. For the sake of simplicity of explanation, the example methods disclosed in FIGS. 6-7 are presented and described as a series of blocks (with each block representing one or more actions or operations in the example method, for example). However, it is to be understood and appreciated that the disclosed techniques are not limited by the order of blocks and associated actions or operations shown in FIGS. 6-7, as some blocks may occur in different orders and/or concurrently with other blocks from that are shown and described herein. Furthermore, not all illustrated blocks, and associated action(s), may be required to implement methods provided herein.

FIG. 6 illustrates a flow of steps in a method for providing an embedded antenna in an integrated circuit, according to some examples provided herein. At block 610, a control circuit with a semiconductor die may be provided. In some embodiments, providing the control circuit (e.g., circuit 120) may include treating within the semiconductor die to form a logic device (e.g., transistors, logic gates, or the like) and any associated storage devices (e.g., capacitors, memory banks, or the like). At block 620, an embedded antenna within the semiconductor die may be provided. In some embodiments, providing the antenna within the semiconductor die may include treating the semiconductor die to form one or more conductive elements (e.g., vias, traces, metal pillars, metal layers, a combination thereof, or the like) at defined intervals. At block 630, an interconnect between the control circuit and the embedded antenna within the semiconductor die may be provided. In some embodiments, providing the interconnect within the semiconductor die may include treating the semiconductor die to form one or more conductive elements (e.g., vias, traces, metal pillars, metal layers, a combination thereof, or the like) at defined intervals. It will be appreciated that although blocks 610, 620, and 630 are depicted as discrete and independent blocks, in some examples the implementation of two ore more of such blocks may be intertwined (e.g., material deposition, material removal, curing or annealing, and the like) to form the control circuit, embedded antenna, and interconnect. It will also be appreciated that an optional AFE and/or optional ADC circuit may be provided during blocks 610-630, or during other blocks during fabrication of the integrated circuit. Following blocks 610-630, the control circuit, the antenna, interconnect therebetween, and other components of the integrated circuit may be packaged together, e.g., into a ceramic package. The control circuit may be configured to control the function of the integrated circuit responsive to a control signal wirelessly received by the embedded antenna, e.g., in a manner such as described with reference to FIG. 1.

FIG. 7 presents a flow of steps in a method for operating an embedded antenna in an integrated circuit, according to some examples provided herein. At block 710, an integrated circuit is provided that includes an embedded antenna and control circuit. Providing the integrated circuit including an embedded antenna and control circuit may be accomplished, for example, by implementing the example method 600 described herein in connection with FIG. 6. At block 720, the embedded antenna may wirelessly receive a control signal, e.g., via deep-space wireless communications or via a terrestrial radio channel, such as a wireless point-to-point communication channel (e.g., a Bluetooth® channel, a NFC channel, and/or a channel for communication between RFID devices). Regardless of the wireless communication protocol utilized for to provide (e.g., encode, modulate, and/or send) the control signal, it is noted that the control signal may be embodied in or may include an instruction for the integrated circuit or a portion thereof (e.g., the control circuit included in the integrated circuit). At block 730, the received control signal is provided to the control circuit, e.g., from the embedded antenna via an interconnect in a manner such as described with reference to FIG. 1, via an AFE and interconnects in a manner such as described with reference to FIG. 2, or via an AFE, ADC, and/or interconnects in a manner such as described with reference to FIG. 3. At block 740, the control circuit controls a function of the integrated circuit responsive to the control signal, e.g., in a manner such as described with reference to FIG. 1.

Conditional language, such as, "may," "could," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

As used herein, the terms "about" and "approximately" are intended to mean within 10% of the stated value.

What has been described herein in the present specification and annexed drawings includes examples of integrated circuits that have embedded therein an antenna for reception of wireless signal and techniques for providing and configuring such integrated circuits. It is, of course, not possible to describe every conceivable combination of elements and/or methodologies for purposes of describing the various features of the disclosure, but one of ordinary skill in the art may recognize that many further combinations and permutations of the claimed subject matter are possible. Accordingly, it may be apparent that various modifications may be made to the disclosure without departing from the scope or spirit thereof. In addition or in the alternative, other embodiments of the disclosure may be apparent from consideration of the specification and annexed drawings, and practice of the disclosure as presented herein. It is intended that the examples put forward in the specification and annexed drawings be considered, in all respects, as illustrative and not restrictive. Although specific terms are employed herein, they are used in a generic and descriptive sense only and not for purposes of limitation.

What is claimed is:

1. An integrated circuit within a semiconductor die comprising a plurality of metallization layers, the integrated circuit comprising:
    a control circuit formed using at least one of the metallization layers within the semiconductor die;
    an antenna formed using at least one of the metallization layers of the semiconductor die and configured to wirelessly receive a control signal at a predefined frequency; and
    an interconnect formed using at least one of the metallization layers of the semiconductor die and configured to provide the control signal from the antenna to the control circuit, the control circuit configured to control a function of the integrated circuit responsive to the received control signal.

2. The integrated circuit of claim 1, wherein the antenna comprises a first patterned metal layer.

3. The integrated circuit of claim 2, wherein the first patterned metal layer is disposed over the control circuit.

4. The integrated circuit of claim 3, wherein the first patterned metal layer is the top metal layer in the semiconductor die.

5. The integrated circuit of claim 2, wherein the interconnect comprises a second patterned metal layer disposed over the control circuit and disposed below the first patterned metal layer.

6. The integrated circuit of claim 1, wherein the integrated circuit comprises a field-programmable gate array (FPGA).

7. The integrated circuit of claim 1, wherein the integrated circuit comprises an application specific integrated circuit (ASIC).

8. The integrated circuit of claim 1, wherein the integrated circuit comprises a field-programmable gate array (FPGA), and wherein the antenna and the interconnect are programmed into configurable logic blocks of the FPGA.

9. The integrated circuit of claim 1, wherein the antenna comprises a monopole.

10. The integrated circuit of claim 1, wherein the antenna has a length between about 1 µm and about 50 mm.

11. The integrated circuit of claim 1, wherein the semiconductor die comprises silicon, gallium arsenide, germanium, silicon-germanium, gallium nitride, or a combination thereof.

12. The integrated circuit of claim 1, wherein the predefined frequency is between about 1 MHz and about 1000 MHz.

13. The integrated circuit of claim 1, wherein the control signal comprises an encryption key, and wherein the control circuit is configured to apply the encryption key to the function of the integrated circuit.

14. The integrated circuit of claim 1, wherein the control circuit is configured to enable the function of the integrated circuit responsive to the control signal.

15. The integrated circuit of claim 1, wherein the control circuit is configured to disable the function of the integrated circuit responsive to the control signal.

16. The integrated circuit of claim 1, wherein the control circuit is configured to alter an output of the integrated circuit responsive to the control signal.

17. The integrated circuit of claim 1, further comprising an analog front-end circuit coupled to the antenna and configured to process the received signal for use by the control circuit.

18. The integrated circuit of claim 1, further comprising an analog-to-digital converter coupled to the antenna and configured to digitize the received signal for use by the control circuit.

19. A method of making an integrated circuit within a semiconductor die, the semiconductor die comprising a plurality of metallization layers, the integrated circuit having a function, the method comprising:
    forming a control circuit within the semiconductor die using at least one of the metallization layers within the semiconductor die;

forming an embedded antenna within the semiconductor die using at least one of the metallization layers within the semiconductor die; and forming an interconnect between the control circuit and the antenna using at least one of the metallization layers within the semiconductor die, wherein the control circuit is configured to control the function of the integrated circuit responsive to a control signal wirelessly received by the embedded antenna.

20. A method of controlling an integrated circuit, the method comprising:

providing an integrated circuit within a semiconductor die, the semiconductor die comprising a plurality of metallization layers, the integrated circuit including an embedded antenna formed using at least one of the metallization layers within the semiconductor die and a control circuit formed using at least one of the metallization layers within the semiconductor die;

wirelessly receiving a control signal by the embedded antenna;

providing the received control signal to the control circuit; and controlling, by the control circuit, a function of the integrated circuit responsive to the control signal.

* * * * *